United States Patent [19]

Krumboltz et al.

[11] Patent Number: 5,093,569
[45] Date of Patent: Mar. 3, 1992

[54] TAPERED OPTICAL FIBER SENSOR

[75] Inventors: Howard D. Krumboltz, Chalfont; Lloyd C. Bobb, Warminster, both of Pa.

[73] Assignee: The United States of America as represented by the Secretary of the Navy, Washington, D.C.

[21] Appl. No.: 587,276

[22] Filed: Sep. 21, 1990

[51] Int. Cl.$^5$ .......................... H01J 5/16; G01D 5/34; G02B 6/26
[52] U.S. Cl. .......................... 250/227.16; 250/231.19; 385/15; 385/123
[58] Field of Search ...................... 250/227.16, 227.14, 250/231.1, 231.19, 227.15; 350/96.15, 96.29; 73/705; 324/260

[56] References Cited

U.S. PATENT DOCUMENTS

| | | | |
|---|---|---|---|
| 4,358,678 | 11/1982 | Lawrence | 250/227.14 |
| 4,443,700 | 4/1984 | Macedo et al. | 250/227.16 |
| 4,634,858 | 1/1987 | Gerdt et al. | 250/227.14 |
| 4,729,630 | 3/1988 | Martinez | 250/227.16 |
| 4,895,423 | 1/1990 | Bilodeau et al. | 250/227.14 |
| 4,918,305 | 4/1990 | Wlodarczyk et al. | 250/227.14 |
| 4,936,649 | 6/1990 | Lymer et al. | 250/227.14 |
| 4,972,073 | 11/1990 | Lessing | 250/227.16 |

Primary Examiner—David C. Nelms
Assistant Examiner—Michael Messinger
Attorney, Agent, or Firm—James V. Tura; James B. Bechtel; Susan E. Verona

[57] ABSTRACT

A sensor is disclosed in which light is launched into the core of a single-mode optical fiber having a tapered-down or narrow waist region between 2 tapers along an internal portion of the length thereof. The fiber is positioned so that a physical effect to be measured bends the fiber in the narrow waist region. The intensity of the light exiting from the core of the fiber is measured and the displacement is determined in accordance with the measured intensity. The narrow waist region of the fiber has a $V_{co}$ parameter of less than 1. A bellows which changes dimension with a change in pressure may be coupled to the fiber to bend it in the waist region in proportion to pressure changes. A magnetostrictive element which changes dimension with changing magnetic field may be coupled to the narrow waist region so that a change in dimension causes a displacement which bends the fiber.

16 Claims, 5 Drawing Sheets

TAPERED OPTICAL FIBER SENSOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to optical fiber sensors, and more particularly to a tapered optical fiber sensor for measuring a physical effect or phenomenon.

Optical fiber sensors are well-known in the art. Highly sensitive ones are usually configured as optical interferometers requiring a single-frequency light source as well as one or more optical fiber couplers. Although highly sensitive, these devices are relatively complex. Less complex but less sensitive devices are usually made from multi-mode fibers and LEDs in which the amplitude of the light through the fiber is altered by the perturbation being sensed. No current design of optical fiber sensor offers high sensitivity without the complexity.

Single-mode tapered fibers have been studied and used as fused, tapered couplers and polarization controllers. Light loss as a function of taper length in tapered fibers has also been studied. The sensitivity of tapered fibers to bending has not, however, been realized or exploited as a sensor.

SUMMARY OF THE INVENTION

It is an object of the present invention to provide a method and apparatus for measuring a physical effect.

It is a specific object to measure a physical effect using an optical fiber sensor which has a high degree of sensitivity yet is simpler in design than currently-used highly sensitive optical fiber sensors.

It is another object to measure pressure changes with a high degree of sensitivity.

It is still another object to measure magnetic field changes with a high degree of sensitivity.

These and other objects are accomplished by a sensor in which light is launched into the core of a single-mode optical fiber having a tapered-down or narrow waist region between 2 tapers along an internal portion of the fiber's length. The fiber is positioned so that the physical effect to be measured bends the fiber in the narrow waist region. The intensity of the light exiting from the core of the fiber is measured and the physical effect is determined in accordance with the measured intensity. The narrow waist region of the fiber has a $V_{co}$ parameter of less than 1. A bellows which causes displacement with a change in pressure may be coupled to the waist region to bend it in proportion to pressure changes. A magnetostrictive element which changes dimension with changing magnetic field may be coupled to the waist region so that a change in magnetic field and thus in dimension bends the fiber.

Other objects, advantages, and novel features of the invention will become apparent from the following detailed description of the invention when considered in conjunction with the accompanying drawings.

DETAILED DESCRIPTION OF THE INVENTION

Figure 1:
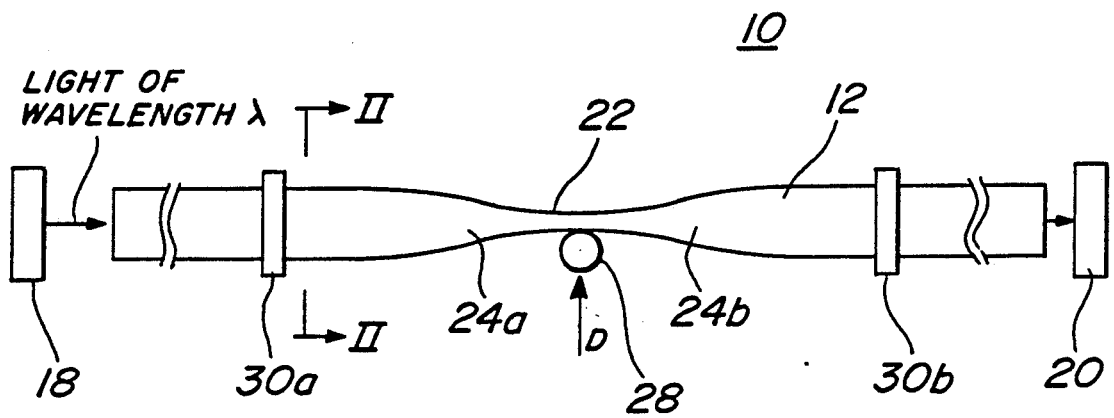
FIG. 1 is a diagrammatic view of the optical fiber sensor of the present invention.
Figure 2:
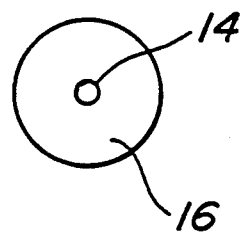
FIG. 2 is a cross-sectional view of the fiber of FIG. 1 taken along the line 2—2.

Referring now to the drawings wherein like characters designate like or corresponding parts throughout the several views, there is shown in FIG. 1 a diagrammatic view of the tapered optical fiber sensor 10 of the present invention. Sensor 10 has a single-mode fiber 12 made up of a core 14 and cladding 16 surrounding the core, as shown in FIG. 2. Light of a given wavelength λ from a light source 18 is launched into core 14 of fiber 12 and the intensity of the transmitted light is monitored by detector 20. Light source 18 may be a light-emitting diode (LED), for instance. Detector 20 may be a silicon photodiode. Fiber 12 has a tapered-down or narrow waist region 22 between two tapers 24a and 24b. The diameter of the waist region is such that the $V_{co}$ parameter of the waist region for a given wavelength of light transmitted therethrough is less than 1, where $$V_{co} = 2\pi/\lambda r_{co}(n_{co}^2 - n_{cl}^2)^{\frac{1}{2}}$$

and $r_{co}$ = radius of core 14 in waist region 22
$n_{co}$ = index of refraction of core 14
$n_{cl}$ = index of refraction of cladding 16
λ = wavelength of light through fiber 12.

Tapering of fiber 12 can be achieved by drawing out the fiber while heating it, as in a platinum ribbon furnace (not shown).

Figure 3:
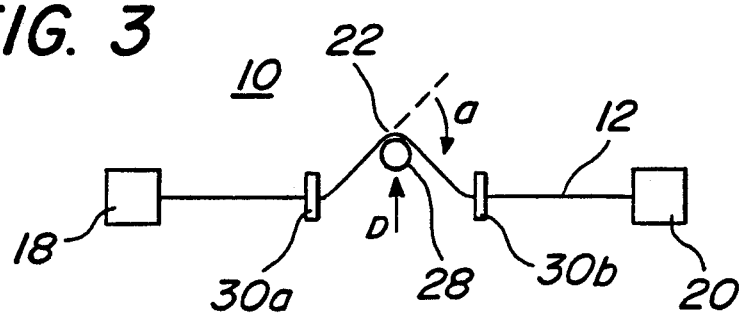
FIG. 3 is a diagrammatic view of the optical fiber sensor of FIG. 1 being bent according to the invention.

As shown diagrammatically in FIG. 3, fiber 12 is then bent at an angle a in waist region 22, altering the intensity of light transmitted through core 14 of the fiber. The intensity of the transmitted light as monitored by detector 20 varies with varying bend angle a, as shown by curve 26 in FIG. 4.

Figure 5:
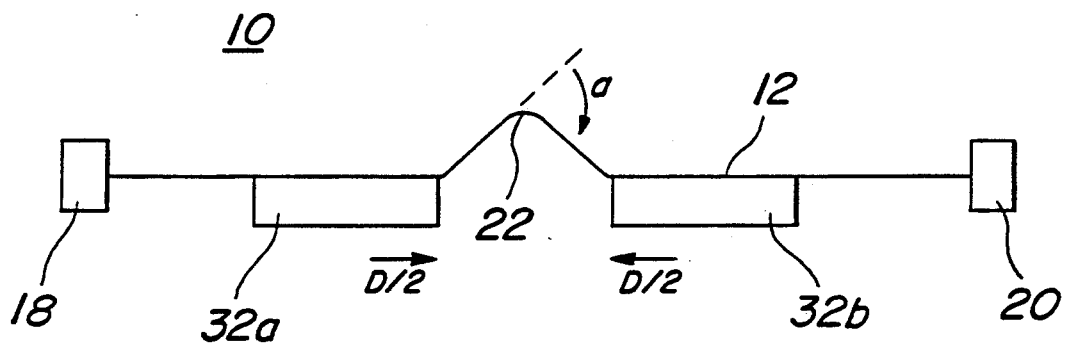
FIG. 5 is a diagrammatic view of an alternate embodiment of the optical fiber sensor of the present invention.

Any physical effect or phenomenon which can bend fiber 12 at waist region 22 can be sensed, and after calibration of sensor 10 the phenomenon can be quantified. For instance, bending may be caused by a transducer 28 coupled to waist region 22 for displacing it in proportion to the physical effect or phenomenon to be sensed (represented by displacement D in FIG. 3). Fiber holders 30a and 30b help control the position and bending of fiber 12. Alternatively, fiber 12 can be positioned so that the effect to be sensed displaces the fiber at some other location along its length, which displacement would bend the fiber in waist region 22 (not shown). FIG. 5 shows yet another diagrammatic configuration representing how a relative displacement D between two elements 32a and 32b can bend fiber 12 and thereby be measured by measuring a change in light intensity received at detector 20. Such a configuration could be used to measure strain in a material, for instance.

Maximum sensitivity of sensor 10 can be achieved by operating it at the steepest slope A of curve 26 where the greatest intensity change occurs per change in bend angle a. Optical fiber 12 is therefore preferably bent in waist region 22 at an angle which corresponds to the steepest slope A of curve 26 prior to taking measurements.

The sensitivity of sensor 10 can be illustrated by the following specific example. A sensor 10 was built according to the present invention using a single-mode silica optical fiber 12 from Lightwave Technologies, Inc. (F1506-C) with a 125 micron outer diameter, a 4 micron core 14, and a numerical aperture $((n_{co}^2-n_{cl}^2)^{\frac{1}{2}})$ of 0.11. Fiber 12 was biconically tapered with a waist region 22 diameter of 20 microns and a waist region length of 2.5 mm. To achieve the taper, fiber 12 was elongated 1.5 cm by applying a tension of 5 to 10 grams to the fiber while it was being heated in a 1 cm wide platinum ribbon furnace (not shown). The taper was asymmetric due to fiber 12 being stretched by holding one end of the fiber and applying tension to the other end. The asymmetry may be reduced by applying tension to both ends, although no difference in bend sensitivity will be observed. The stretching of optical fiber 12 resulted in a loss in transmitted intensity of up to 30 percent.

Figure 6:
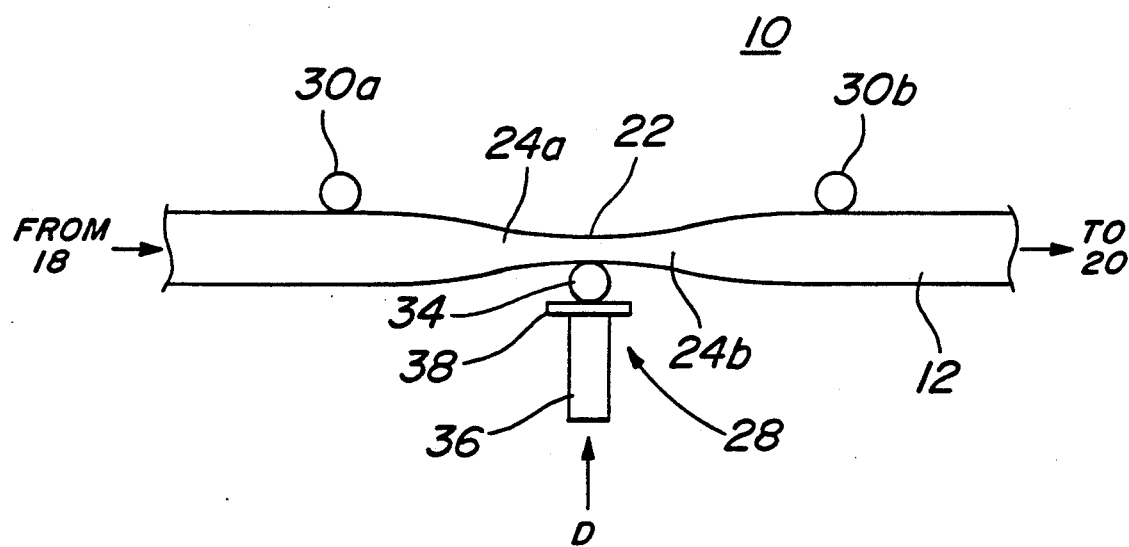
FIG. 6 is a diagrammatic view of a specific embodiment of the optical fiber sensor for testing its sensitivity.

Referring now to diagrammatic FIG. 6, fiber 12 was then put in tension by applying a few grams thereto while it was brought into contact with fiber holders 30a and 30b, which were two glass rods 0.5 cm in diameter and positioned 5.7 cm apart on opposite sides of waist region 22. Transducer 28 was a capillary tube 34 driven by a micrometer 36. Capillary tube 34, 0.09 cm in diameter, was positioned transversely to fiber 12 adjacent to waist region 22, midway between glass rods fiber holders 30a and 30b. Piezoelectric transducer 38, was also connected to capillary tube 34 to produce very small displacements. Fiber 12 was aligned so that capillary tube 34 would displace fiber waist region 22 in a direction which was perpendicular to the plane containing glass rods 30a and 30b when micrometer 38 was driven to cause a displacement. The geometric relationship between displacement and bend angle a was noted. The light of wavelength λ from light source 18 transmitted through fiber 12 and exiting from core 14 was monitored.

Figure 4:
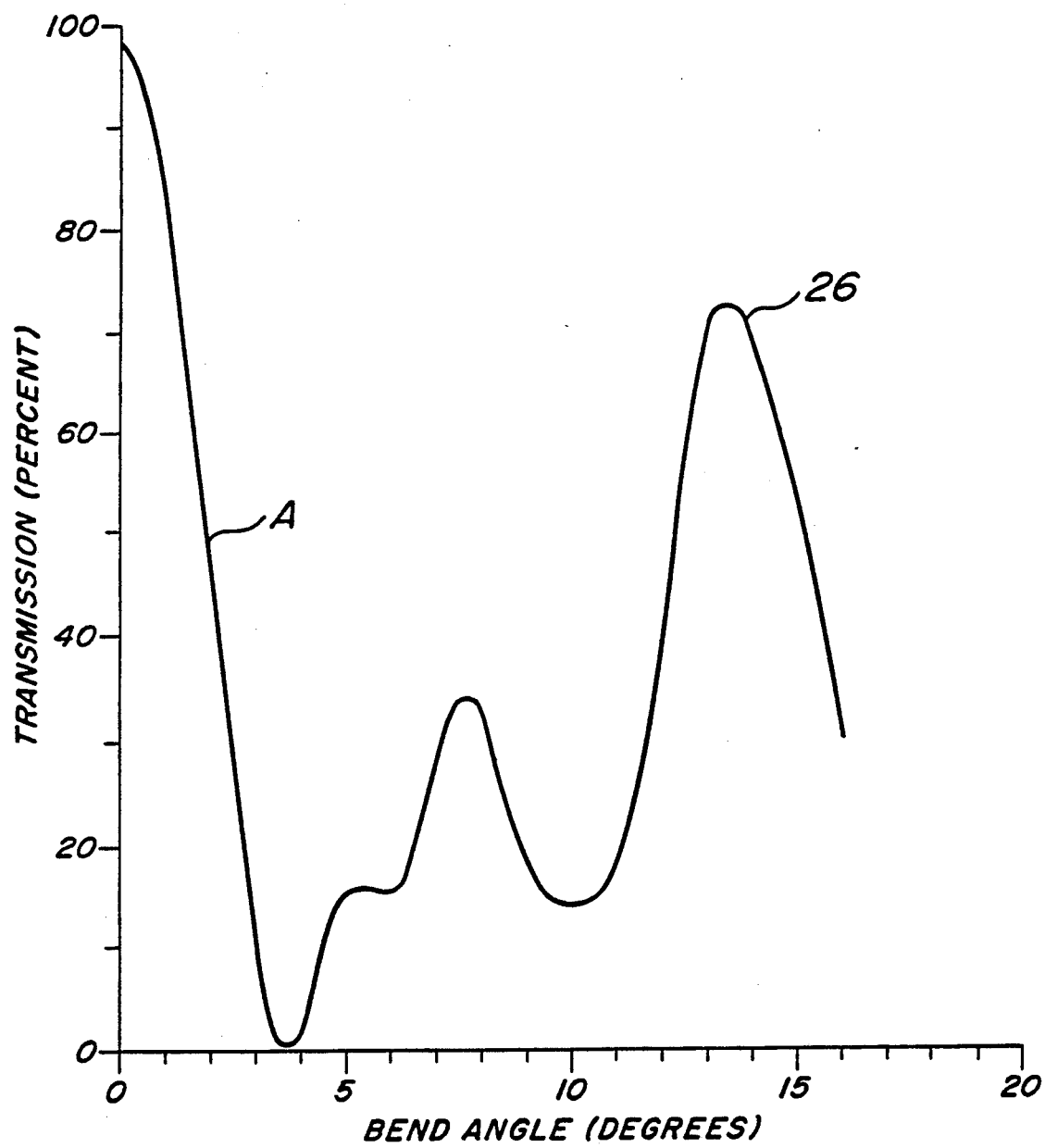
FIG. 4 is a graphical representation of the intensity of transmitted light vs. bend angle using the present invention.

Curve 26 in FIG. 4 shows how the intensity changed with changing bend angle a using the above-described apparatus for λ=0.63 microns. A displacement of 0.09 cm, which corresponded to a bend angle a of 3.6 degrees, produced the first minimum in light intensity. For a given arrangement, the first minimum will occur at higher bend angles for longer wavelengths. Continued bending resulted in additional maxima and minima which were not as large as the first. The sensitivity of the sensor in the maximum slope region A of curve 26 was determined by using piezoelectric element 38 to produce small displacements. Displacements as small as 0.15 angstroms were detectable.

The intensity versus bend angle relationship shown in FIG. 4 is due to the narrowing introduced by the tapering and to the subsequent bending. In waist region 22, where the $V_{co}$ parameter is less than 1.0, the light is no longer guided by the core-cladding boundary, but by the cladding-air boundary, thus behaving like a multi-mode fiber in that section. The tapering produces coupling among modes supported by this multi-mode fiber. The bending process alters this coupling resulting in the maxima and minima observed. Essentially, then, interference is occurring within one fiber in tapered narrow waist region 22.

Figure 7:
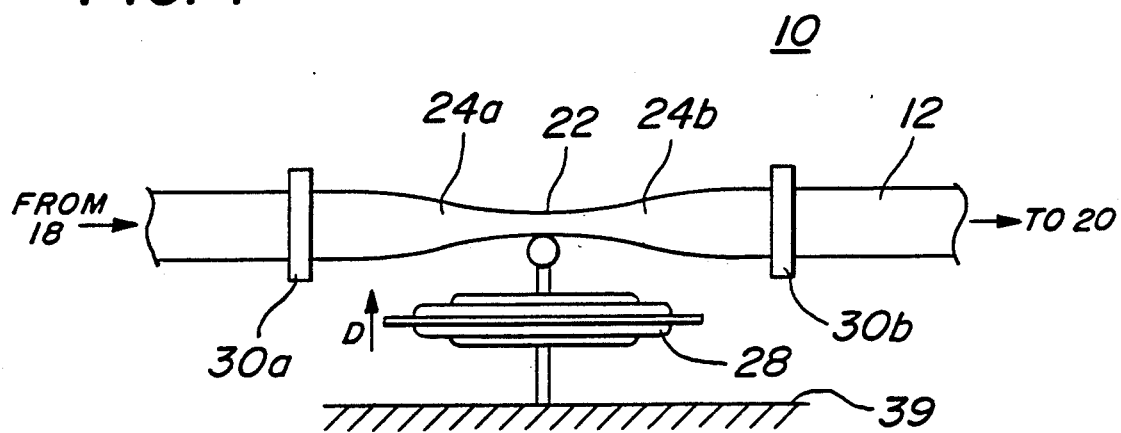
FIG. 7 is a diagrammatic view of the sensor of the present invention being used to measure pressure change.

Sensor 10 can be used to measure changes in pressure, in which case transducer 28 is a bellows 28a (which changes dimensions with pressure) connected to ground 39, as shown in diagrammatic FIG. 7. The dimensional change which occurs with changing pressure displaces fiber 12 in waist region 22, thereby bending it. Knowing the relationships between pressure and displacement, displacement and bend angle a, and bend angle a and intensity one can determine, the pressure by measuring the intensity change. Of course, sensor 10 can be calibrated to provide a direct readout of pressure. Using the tapered fiber 12 from the above-described experimental apparatus as a pressure sensor, an altitude change of 30 cm (3.7 Pa) was detectable when fiber 12 was first bent to the steepest slope position.

Magnetic field changes may similarly be sensed wherein transducer 28 is a magnetostrictive element which changes dimension with changing magnetic field (not shown). The fiber described above was used in this way to yield a sensitivity of approximately one gamma. Similarly high sensitivity is observed using the Lorenz force to bend fiber 12.

Figure 8:
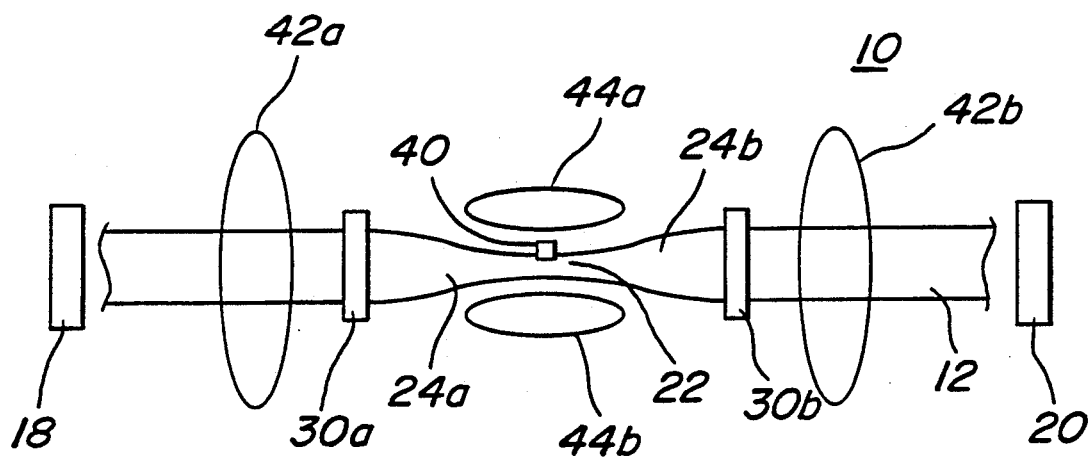
FIG. 8 is a diagrammatic view of the sensor of the present invention being used to measure B vs. H in a magnetic material sample.
Figure 9:
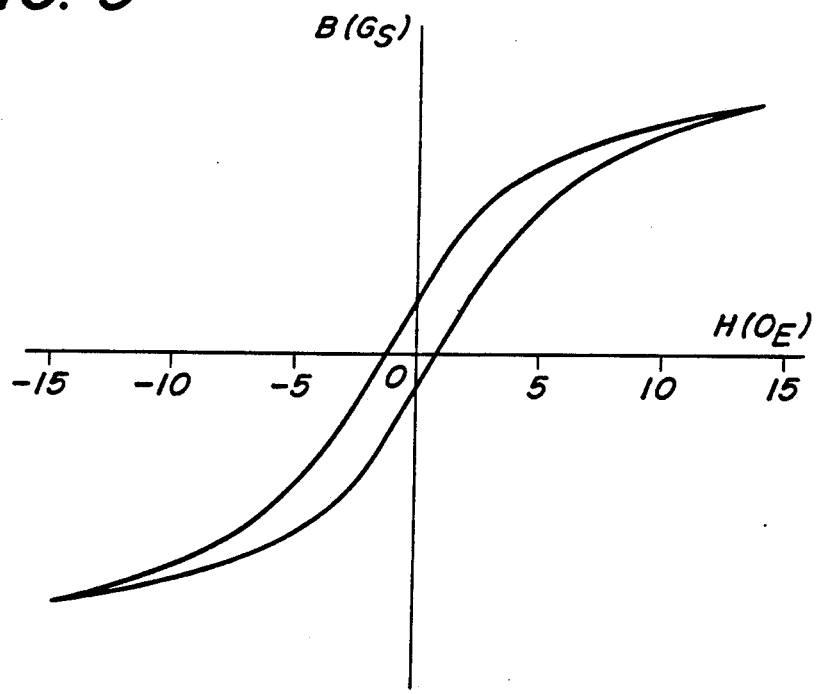
FIG. 9 is a B vs. H curve for a magnetic material sample generated using the sensor of the present invention.

Referring now to diagrammatic FIG. 8, the sensor 10 of the present invention can also be used to measure B versus H in very small samples of magnetic materials. Fiber 12 is mounted on fiber holders 30a and 30b and configured between source 18 and detector 20 so that light launched through the fiber can be monitored. The magnetic sample 40 to be tested is fixed to waist region 22. A pair of magnetic fields is applied to sample 40 via Helmholtz coils 42a and 42b and gradient coils 44a and 44b. A gradient close to the mechanical resonance frequency of fiber 12 is applied to the fiber while a uniform magnetic field applied to the fiber is slowly ramped. As the uniform field is increased the magnetic polarization of sample 40 increases through the magnetic susceptibility. The bending force on fiber 12 depends on the gradient field and the magnetic polarization. Its effect on light intensity is monitored. A B-H loop acquired using this method is shown in FIG. 9. The test sample 40 was a metallic glass ribbon fragment with a volume of $2.0 \times 10^{-6}$ cm$^3$. Based on the signal-to-noise ratio and the bandwidth for these measurements, it is estimated that the signal would be detectable with a reduction of 3500 in sample volume. That is, samples with volumes of $5.7 \times 10^{-10}$ cm$^3$ would have sufficient magnetic polarization to yield a recordable signal.

Figure 10:
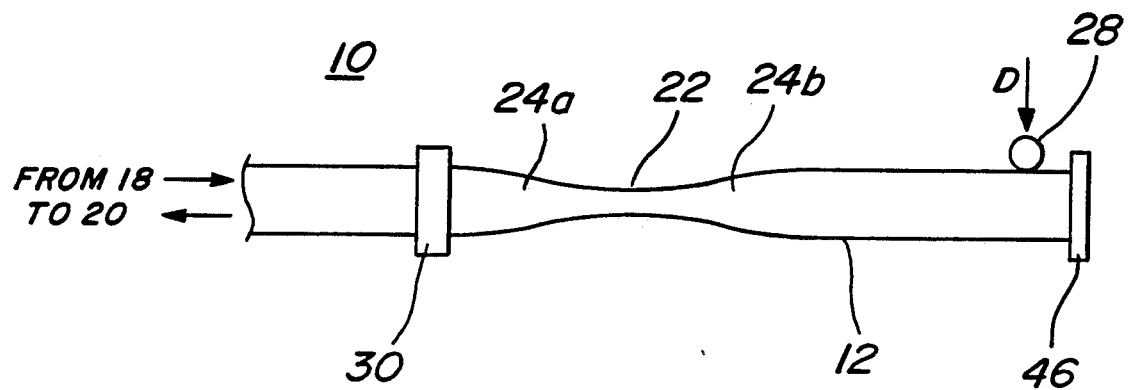
FIG. 10 is an alternate embodiment of the optical fiber sensor of the present invention.

Other embodiments of the present invention are possible. For example, the sensor 10 may be single-ended so that waist 22 is used twice, as shown in diagrammatic FIG. 10. Reflecting surface 46 is then positioned at one end of fiber 12 to reflect the transmitted light from source 18 back through the fiber and hence through waist region 22 again. Detector 20 is then positioned at the same end of fiber 12 as light source 18. With such a sensor configuration, fiber 12 could be positioned so that the physical effect to be sensed bends the fiber by displacing it near that end of the fiber which is connected to reflecting surface 46. Fiber holder 30 holds fiber 12 to ensure that bending caused by displacement D occurs in waist region 22.

Some of the many advantages and features of the invention should now be readily apparent. Tapered fiber sensor 10 of the present invention can be used to measure any effect or phenomenon that bends waist region 22 of fiber 12 by more than about 0.15 angstroms. This tremendous sensitivity is extracted without the complexity of a Michelson or a Mach-Zehnder optical fiber interferometer. And, because the optical path mismatch is small, light source 18 does not have to be single frequency, allowing the use of the less expensive LEDs.

Those skilled in the art will appreciate that many modifications and variations are possible within the concept of the present invention. For example, the tapered, narrow waist region could be surrounded with materials of various indices of refraction. Various degrees of taper could be employed to affect sensitivity and multiple waist regions could be put in one fiber to enhance sensitivity. It is to be understood that these and other modifications fall within the scope of the following claims.

What is claimed is:

1. A method of measuring a physical effect, comprising the steps of:
   launching light of a given wavelength into the core of a single-mode optical fiber having a narrow waist region along the length thereof, said narrow waist region having a Vco parameter of less than one;
   positioning the fiber so that the physical effect to be measured bends the fiber in the narrow waist region;
   measuring the intensity of the light exiting from the core of the fiber; and
   determining the physical effect in accordance with the measured intensity.

2. The method of claim 1, further comprising the step of bending the fiber in the narrow waist region to a position where a maximum change in measured intensity occurs per degree change in bend angle before positioning the fiber.

3. The method of claim 1 wherein the light is launched into the core at one end of the fiber and the intensity is measured at the other end of the fiber.

4. The method of claim 1 further comprising the step of reflecting the light back through the fiber after launching it into the fiber, causing the light to pass through the waist region more than once, wherein light is launched into the core at the same end of the fiber at which the intensity is measured.

5. The method of claim 1 wherein the physical effect bends the fiber by displacing it in the narrow waist region.

6. The method of claim 1 wherein the physical effect to be measured is pressure change.

7. The method of claim 1 wherein the physical effect to be measured is magnetic field change.

8. Apparatus for measuring a physical effect, comprising:
   a single-mode optical fiber for transmitting light of a given wavelength therethrough and having a narrow waist region along the length thereof, said narrow waist region having a Vco parameter of less than one;
   means for launching light of the given wavelength into the core of said optical fiber;
   means for measuring the intensity of light exiting from the core of said optical fiber; and
   means for bending the fiber in the narrow waist region in response to the physical effect to be measured.

9. The apparatus of claim 8, wherein the means for launching light is a light emitting diode.

10. The apparatus of claim 8, wherein the means for measuring intensity is a silicon photodiode.

11. The apparatus of claim 8, wherein the bending means is a transducer for causing displacement in response to the physical effect to be measured.

12. The apparatus of claim 11 wherein the transducer is a bellows which changes dimension with changing pressure.

13. The apparatus of claim 11 wherein the transducer is a magnetostrictive element which changes dimension with changing magnetic field.

14. The apparatus of claim 8, further comprising reflecting means for reflecting the launched light back through the fiber.

15. Apparatus for measuring a change in pressure, comprising:
   a single-mode optical fiber for transmitting light of a given wavelength therethrough and having a core, two ends, and a narrow waist region along the length thereof, said narrow waist region having a Vco parameter of less than one;
   means for launching light of the given wavelength into one end of the core of said optical fiber;
   means for measuring the intensity of light received from the other end of the core of said optical fiber; and
   bellows means for causing displacement in response to pressure change operatively connected so that the displacement bends said optical fiber at the narrow waist region.

16. A method for measuring a change in pressure, comprising the steps of:
   launching light of a given wavelength into one end of the core of a single-mode optical fiber having a narrow waist region along the length thereof, said narrow waist region having a Vco parameter of less than one;
   positioning the fiber so that a change in pressure bends the fiber in the narrow waist region;
   measuring the intensity of the light exiting from the other end of the core of the fiber; and
   determining the pressure change in accordance with the measured intensity.

* * * * *